United States Patent
Murata

(10) Patent No.: US 12,416,828 B2
(45) Date of Patent: Sep. 16, 2025

(54) VEHICLE DISPLAY DEVICE

(71) Applicant: YAZAKI CORPORATION, Tokyo (JP)

(72) Inventor: Naohisa Murata, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 18/769,359

(22) Filed: Jul. 10, 2024

(65) Prior Publication Data

US 2025/0035973 A1    Jan. 30, 2025

(30) Foreign Application Priority Data

Jul. 26, 2023 (JP) ................. 2023-121239

(51) Int. Cl.
*G02F 1/1333* (2006.01)
*B60K 35/23* (2024.01)
*H05K 7/20* (2006.01)

(52) U.S. Cl.
CPC ........ *G02F 1/133385* (2013.01); *B60K 35/23* (2024.01); *G02F 1/133308* (2013.01); *H05K 7/20336* (2013.01); *H05K 7/20963* (2013.01); *H05K 7/2099* (2013.01)

(58) Field of Classification Search
None
See application file for complete search history.

(56) References Cited

U.S. PATENT DOCUMENTS

| 2006/0181670 | A1 | 8/2006 | Kurokawa et al. |
| 2023/0100779 | A1* | 3/2023 | Beaulieu ............ H04B 1/3888 455/575.8 |
| 2023/0176373 | A1* | 6/2023 | Nagai ................ F21V 7/09 359/630 |
| 2023/0413458 | A1* | 12/2023 | Hisatsugu ............ B60K 35/211 |

FOREIGN PATENT DOCUMENTS

| CN | 207604107 U | * | 7/2018 | |
| CN | 208172426 U | * | 11/2018 | |
| CN | 111190321 A | * | 5/2020 | ............ C08K 3/042 |
| JP | 2006-227072 A | | 8/2006 | |

* cited by examiner

*Primary Examiner* — Phu Vu
(74) *Attorney, Agent, or Firm* — KENEALY VAIDYA LLP

(57) ABSTRACT

A vehicle display device includes a housing, a TFT that is accommodated in the housing, a mirror that is accommodated in the housing and reflects display light output from the TFT toward a windshield of a vehicle, a sapphire glass with a transparent plate shape that is disposed in contact with a display surface of the TFT, a lower case that functions as a heat dissipation part that dissipates heat, and a heat pipe that has one end connected to an edge part of the sapphire glass and the other end connected to the lower case, and conducts heat of the sapphire glass to the lower case.

8 Claims, 7 Drawing Sheets

VEHICLE DISPLAY DEVICE

CROSS-REFERENCE TO RELATED APPLICATION(S)

The present application claims priority to and incorporates by reference the entire contents of Japanese Patent Application No. 2023-121239 filed in Japan on Jul. 26, 2023.

BACKGROUND OF THE INVENTION

1. Field of the Invention

The present invention relates to a vehicle display device.

2. Description of the Related Art

One example of the conventional vehicle display devices is a liquid crystal display device according to Japanese Patent Application Laid-open No. 2006-227072, which performs desired display with liquid crystals. This liquid crystal display device includes a liquid crystal display element that performs display with liquid crystals, a light source that illuminates the liquid crystal display element, an optical waveguide that is disposed on a back surface side of the liquid crystal display element and emits light from the light source toward the liquid crystal display element, a wiring board including a liquid crystal driving circuit part that drives the liquid crystal display element, a driving circuit that performs on/off driving of the light source and serves as a heat source for generating heat, a heat dissipation member that dissipates the heat generated by the driving circuit, and a heat-conductive member that is formed of a member having higher heat conductivity than the heat dissipation member and connects the driving circuit and the heat dissipation member. In the liquid crystal display device, the heat dissipation member is separated from the driving circuit and the heat dissipation member is connected to the driving circuit through the heat-conductive member.

In the liquid crystal display device according to Japanese Patent Application Laid-open No. 2006-227072, the heat of the driving circuit that drives the light source is dissipated by the heat dissipation member. For example, it has been demanded to dissipate the heat of the liquid crystal display element so that the temperature increase of the liquid crystal display element is suppressed.

SUMMARY OF THE INVENTION

The present invention has been made in view of the above, and it is an object of the present invention to provide a vehicle display device capable of suppressing temperature increase of a liquid crystal display element.

In order to achieve the above mentioned object, a vehicle display device according to one aspect of the present invention includes a housing; a liquid crystal display element that is accommodated in the housing; a mirror that is accommodated in the housing and reflects display light output from the liquid crystal display element toward a transparent reflection member of a vehicle; a heat-conductive plate member with a transparent plate shape that is disposed in contact with any of a display surface and a rear surface of the liquid crystal display element; a heat dissipation part that dissipates heat; and a heat pipe that has one end connected to an edge part of the heat-conductive plate member and the other end connected to the heat dissipation part, and conducts heat of the heat-conductive plate member to the heat dissipation part.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Modes (embodiments) for carrying out the present invention will be described in detail with reference to the drawings. The contents of the embodiments given below do not limit the present invention. The components to be described below include those that can be readily conceived by people who are skilled in the art and those that are substantially the same. Furthermore, the configurations to be described below can be combined as appropriate. In addition, various omissions, substitutions, or changes of the configurations can be made without departing from the gist of the present invention.

Figure 1:
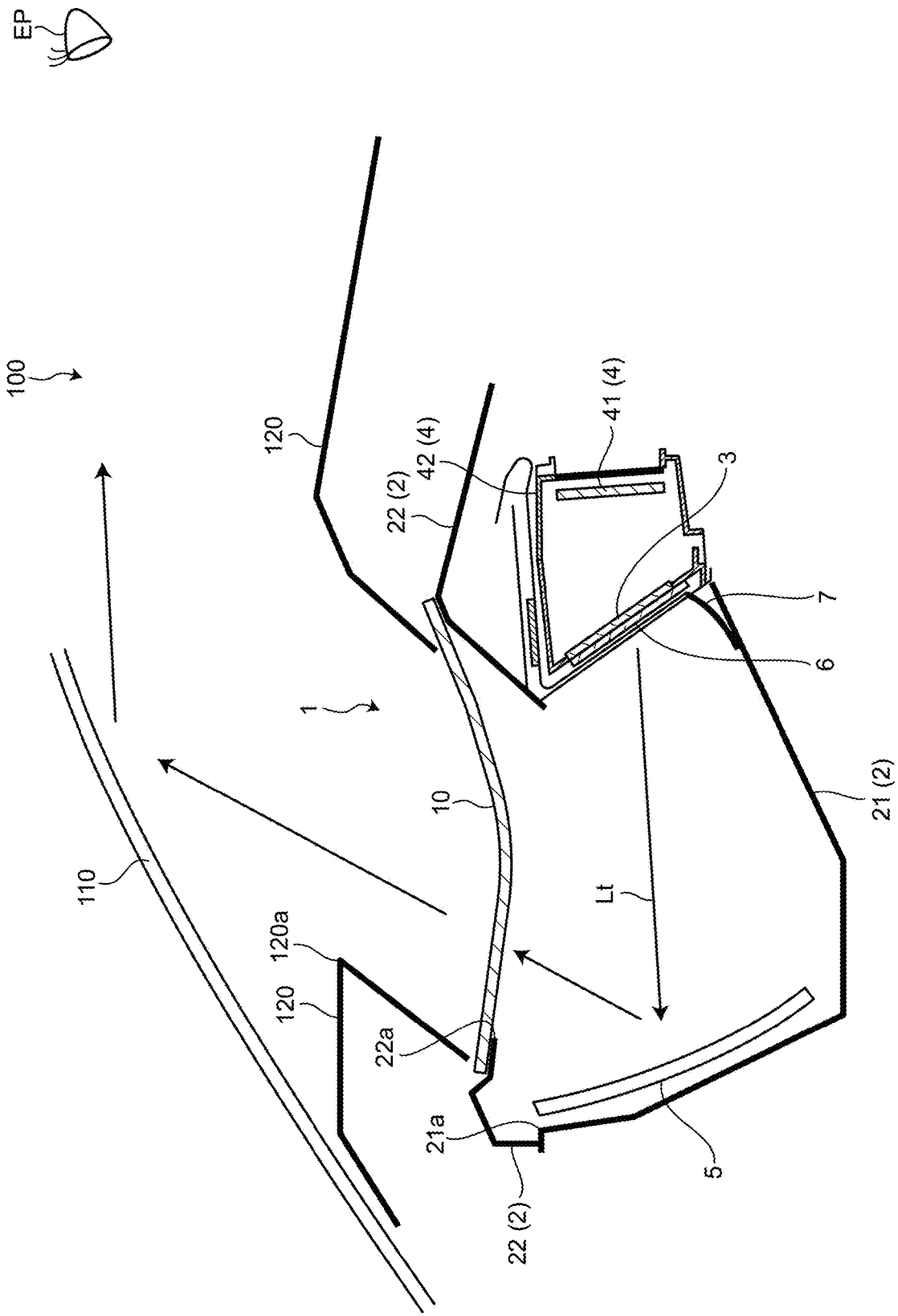
FIG. 1 is a diagram illustrating a structure example of a vehicle display device according to an embodiment.

As illustrated in FIG. 1, a vehicle display device 1 according to an embodiment is a head-up display that is mounted on a vehicle 100 such as an automobile and displays a virtual image by reflecting display light Lt, which is emitted toward a windshield 110 that transmits light, to an eye point EP side at the windshield 110. The vehicle display device 1 includes a housing 2, a TFT 3 as a liquid crystal display element, a backlight unit 4, a mirror 5, a sapphire glass 6 as a heat-conductive plate member, a heat pipe 7, and a transparent cover 10.

The housing 2 is accommodated below a dashboard 120 of the vehicle 100. The dashboard 120 has an opening 120a through which the display light Lt of the vehicle display device 1 passes. The opening 120a faces the windshield 110 in a vertical direction of the vehicle 100. The housing 2 is formed of a light-shielding material. At least a part of the housing 2 is formed of a material with high heat conductivity, such as metal. The housing 2 includes a lower case 21 and an upper cover 22. The lower case 21 is a box-shaped member formed of metal and being open upward in the vertical direction. The lower case 21 accommodates the TFT 3, the backlight unit 4, the mirror 5, the sapphire glass 6, and the heat pipe 7, and these components are fixed. The upper cover 22 is attached to the lower case 21 and closes an opening part 22a of the lower case 21. The upper cover 22 has the opening part 22a through which light passes. The opening part 22a is closed by the transparent cover 10 that transmits light.

The TFT 3 is a display element including liquid crystal that displays images. The TFT 3 is, for example, a thin film transistor-liquid crystal display (TFT-LCD). The TFT 3 is a film-shaped member that includes a liquid crystal layer, a glass electrode, a polarizer, and the like. The TFT 3 is formed in a rectangular shape and has a display surface 3a (see FIG. 2) that outputs the display light Lt. In the following description, a surface of the TFT 3 on the side opposite to the display surface 3a is referred to as a rear surface 3b. The TFT 3 has the display surface 3a provided on the mirror 5 side and the rear surface 3b provided on the backlight unit 4 side.

The backlight unit 4 emits light to the rear surface 3b of the TFT 3. The backlight unit 4 includes a light source 41 and a backlight case 42. The light source 41 includes a plurality of light-emitting bodies. The light-emitting body is, for example, a light emitting element such as an LED. The light source 41 is provided facing the rear surface 3b of the TFT 3 and emits light to the rear surface 3b of the TFT 3. The backlight case 42 is formed of a light-shielding material and accommodates the light source 41 and the like.

The mirror 5 is a mirror that reflects the display light Lt incident from the TFT 3 side toward the windshield 110 of the vehicle 100. The shape of a reflection surface of the mirror 5 is, for example, a concave free-form surface. The reflection surface of the mirror 5 is formed to magnify the image by the display light Lt. The display light Lt reflected by the mirror 5 passes through the transparent cover 10 and enters the windshield 110. The windshield 110 reflects the display light Lt toward the eye point EP of the vehicle 100. The driver of the vehicle 100 sees the virtual image by the display light Lt reflected by the windshield 110.

Figure 2:
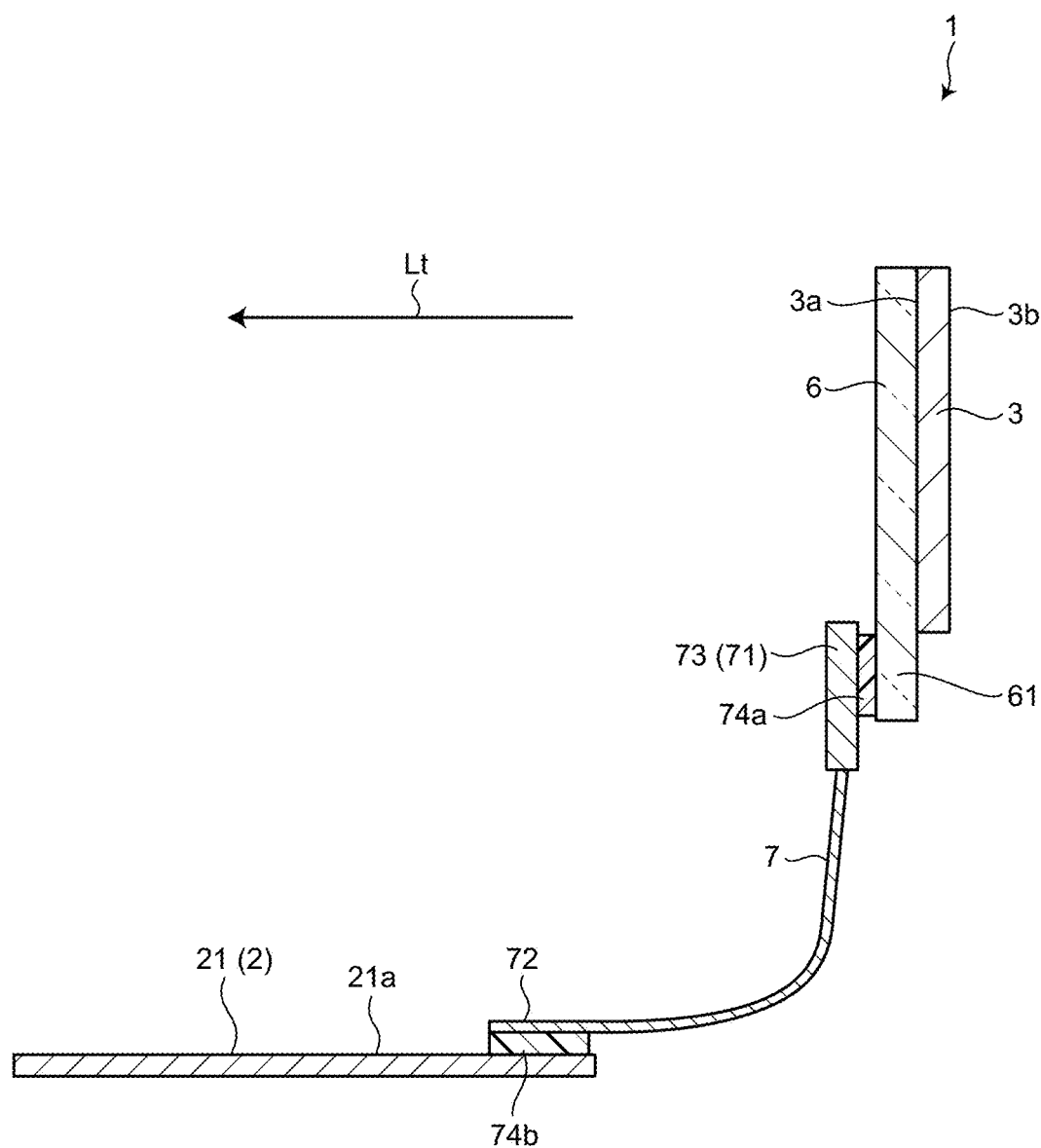
FIG. 2 is a diagram illustrating a connection example of a heat pipe according to the embodiment.

The sapphire glass 6 is a transparent member and transmits light. The sapphire glass 6 is formed by artificially growing high-purity alumina (aluminum oxide) into giant crystals, and has at least higher heat conductivity than air. The sapphire glass 6 is formed in a rectangular flat shape and is formed as large as or a little larger than the TFT 3. The sapphire glass 6 is formed a little larger than the TFT 3, for example, as illustrated in FIG. 2, and an edge part 61 of the sapphire glass 6 on a lower side in the vertical direction protrudes more than an edge part of the TFT 3 on the lower side in the vertical direction. The edge part 61 of the sapphire glass 6 is located outside a display region where the TFT 3 displays images, and the heat pipe 7 to be described below is connected to the edge part 61.

The sapphire glass 6 is disposed in contact with the display surface 3a of the TFT 3. The sapphire glass 6 is attached to the display surface 3a of the TFT 3 by optical bonding, such as an optical clear adhesive (OCA) or an optical clear resin (OCR), and is thus disposed in contact with the display surface 3a of the TFT 3. When the sapphire glass 6 is in contact with the display surface 3a of the TFT 3, the heat of the TFT 3 easily conducts to the sapphire glass 6. The contact area between the sapphire glass 6 and the TFT 3 is desirably large. The sapphire glass 6, for example, is in contact with the entire display surface 3a of the TFT 3. The sapphire glass 6 preferably covers the entire image display region in the TFT 3. In this case, the sapphire glass 6 can suppress the stress application on a local part of the TFT 3 and a bleaching phenomenon can be suppressed. The thickness of the sapphire glass 6 may be greater than the thickness of the TFT 3. The sapphire glass 6 in contact with the TFT 3 can expand the thermal capacity of the TFT 3 and absorbs the heat generated in the TFT 3.

The heat pipe 7 conducts (transports) the heat from the sapphire glass 6 to a heat dissipation part. The heat pipe 7 is formed in a long shape, with a connection part 73 at one end 71 connected to a heat source and the other end 72 connected to the heat dissipation part (low temperature part). The heat from the heat source causes a working fluid to evaporate into a gas, which absorbs the heat as latent heat and transfers to the low temperature part of the pipe. In the heat pipe 7, the working fluid that has transferred to the low temperature part is condensed, releases heat, and then returns to liquid. In this way, the heat pipe 7 efficiently conducts the heat from the heat source to the heat dissipation part. The heat pipe 7 has high heat conductivity. Depending on a bending method, the heat conductivity is approximately 10000 W/m·K to 20000 W/m·K at Φ6 mm, which is by far higher than that of aluminum and the like. In the embodiment, the heat pipe 7 has the connection part 73 at one end 71 connected to the sapphire glass 6 and the other end 72 connected to the lower case 21 made of metal. In the heat pipe 7, for example, the connection part 73 at one end 71 is connected through an adhesive 74a to the edge part 61 of the sapphire glass 6 on the lower side in the vertical direction and the other end 72 is connected through an adhesive 74b to a bottom surface 21a of the lower case 21 made of metal on the lower side in the vertical direction. The heat pipe 7 conducts the heat from the sapphire glass 6, which has absorbed the heat generated in the TFT 3, to the lower case 21 made of metal. Thus, in the vehicle display device 1, the heat generated in the TFT 3 can be dissipated in the lower case 21 made of metal, so that the temperature increase of the TFT 3 can be suppressed.

The vehicle display device 1 according to the embodiment as described above includes the housing 2, the TFT 3 that is accommodated in the housing 2, the mirror 5 that is accommodated in the housing 2 and reflects the display light Lt output from the TFT 3 toward the windshield 110 of the vehicle, the sapphire glass 6 with a transparent plate shape that is disposed in contact with the display surface 3a of the TFT 3, the lower case 21 that functions as the heat dissipation part that dissipates heat, and the heat pipe 7 that has one end 71 connected to the edge part 61 of the sapphire glass 6 and the other end 72 connected to the lower case 21, and conducts the heat of the sapphire glass 6 to the lower case 21.

In the vehicle display device 1 with this structure, the heat from the TFT 3 can be conducted to the lower case 21 through the sapphire glass 6 and the heat pipe 7, and thus, the temperature increase of the TFT 3 can be suppressed. In the vehicle display device 1, one end 71 of the heat pipe 7 is connected to the edge part 61 of the sapphire glass 6, and thus, for example, the bleaching phenomenon caused by the connection of one end 71 of the heat pipe 7 to the edge part of the TFT 3 can be prevented. Since the heat pipe 7 with a relatively small cross-sectional area conducts the heat to the lower case 21 in the vehicle display device 1, the enlargement of the housing 2 can be suppressed compared to a case in which, for example, the heat is dissipated using a heat sink. Compared to a case in which the sapphire glass 6 is extended to the lower case 21 and connected directly to the lower case 21, the vehicle display device 1 can reduce the size of the sapphire glass 6, which is expensive, thus reducing the cost.

In the vehicle display device 1, the housing 2 is formed of metal and functions as the heat dissipation part. The heat pipe 7 has the other end 72 connected to the housing 2 made of metal. This configuration allows the vehicle display device 1 to dissipate heat without using a separate heat sink or the like as the heat dissipation part, thus reducing the increase in the number of components.

Figure 3:
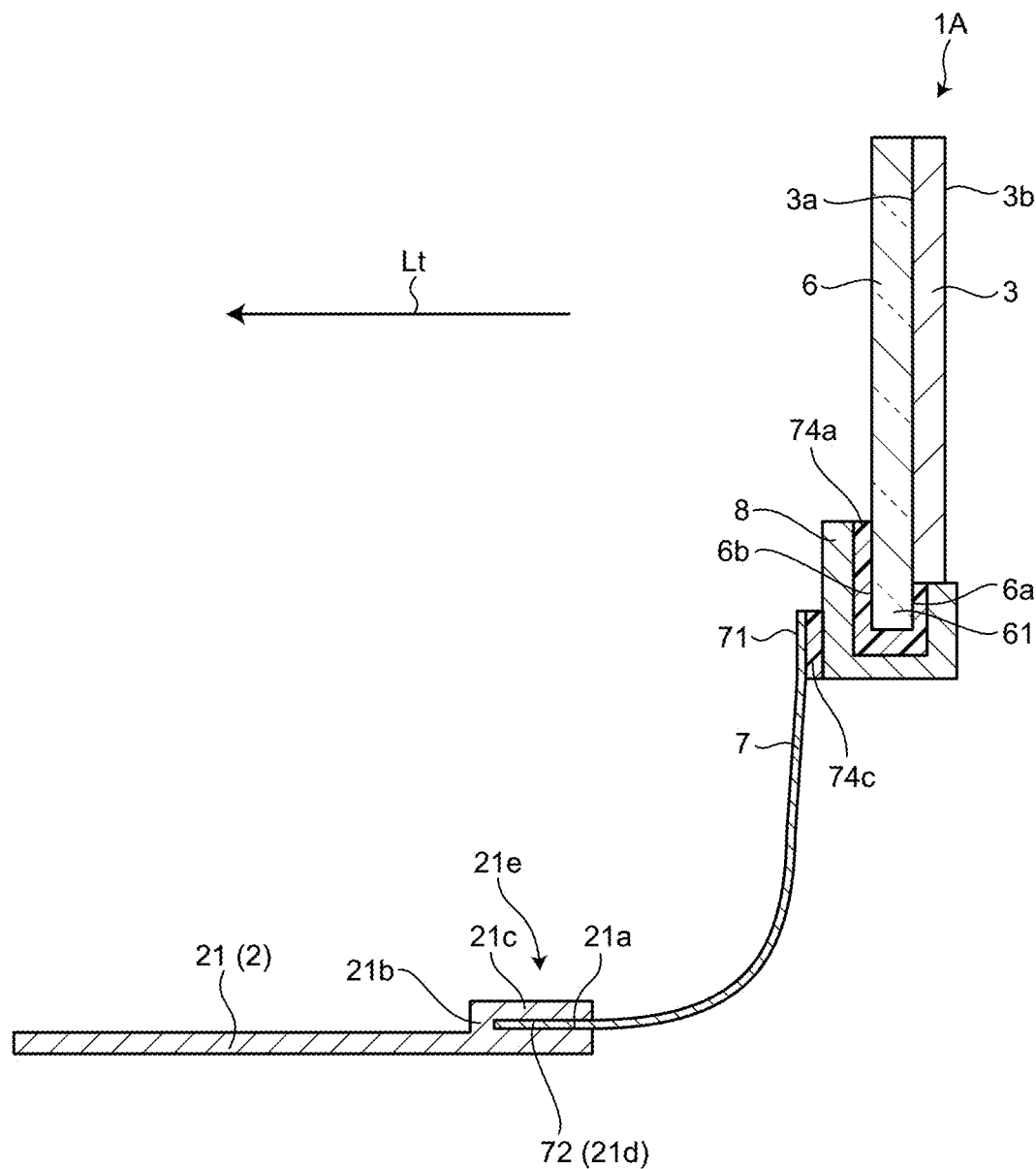
FIG. 3 is a diagram illustrating a connection example of a heat pipe according to a first modification of the embodiment.

Next, modifications of the embodiment are described. In the modifications, the components that are equivalent to those in the embodiment are denoted with the same reference signs, and the detailed descriptions of those components are omitted. FIG. 3 is a diagram illustrating a connection example of the heat pipe 7 of a vehicle display device 1A according to a first modification of the embodiment. The vehicle display device 1A illustrated in FIG. 3 is different from the vehicle display device 1 according to the embodiment in that the vehicle display device 1A has a heat-conductive frame member 8.

As illustrated in FIG. 3, the heat-conductive frame member 8 is provided extending in an extending direction along the edge part 61 of the sapphire glass 6, and a cross-sectional shape thereof in an intersecting direction that intersects with the extending direction is a frame shape. The heat-conductive frame member 8 is, for example, a long member formed of metal with relatively high heat conductivity and extending from one side of the sapphire glass 6 in a width direction to the other. The heat-conductive frame member 8 is fitted into the edge part 61 of the sapphire glass 6 and fixed to the edge part 61 through the adhesive 74a. The heat-conductive frame member 8 is fixed to the edge part 61 of the sapphire glass 6, and in this state, sandwiches and holds the edge part 61 from both sides and is in contact with both surfaces of the edge part 61. In other words, the heat-conductive frame member 8 is in contact with both surfaces of a first surface 6a on the TFT 3 side and a second surface 6b on the opposite side of the TFT 3 side at the edge part 61 of the sapphire glass 6. The heat pipe 7 has one end 71 connected to the heat-conductive frame member 8 through an adhesive 74c. The heat pipe 7 has the other end 72 fixed by being inserted into an insertion part 21e provided in the lower case 21. This insertion part 21e includes the bottom surface 21a of the lower case 21, a side wall 21b erected from the bottom surface 21a, and an upper wall 21c extending from an upper part of the side wall 21b along the bottom surface 21a of the lower case 21 and forming an insertion space part 21d between the bottom surface 21a and the upper wall 21c. The other end 72 of the heat pipe 7 is inserted into the insertion space part 21d between the bottom surface 21a and the upper wall 21c of the lower case 21 and is press-fitted and fixed to the insertion part 21e.

As described above, the vehicle display device 1A includes the heat-conductive frame member 8 that is provided along the edge part 61 of the sapphire glass 6, sandwiches and holds the edge part 61 from both sides, and is in contact with both surfaces of the edge part 61. The heat pipe 7 has one end 71 connected to the edge part 61 of the sapphire glass 6 through the heat-conductive frame member 8. In the vehicle display device 1A with this structure, the heat can be conducted from both surfaces of the sapphire glass 6 to the heat pipe 7, and therefore, the efficiency of heat conduction can be improved and accordingly, the temperature increase of the TFT 3 can be suppressed more.

In the vehicle display device 1A, moreover, the other end 72 of the heat pipe 7 is fixed by being inserted into the insertion part 21e of the lower case 21, making it easier to attach the heat pipe 7 to the lower case 21 and improving the workability.

Figure 4:
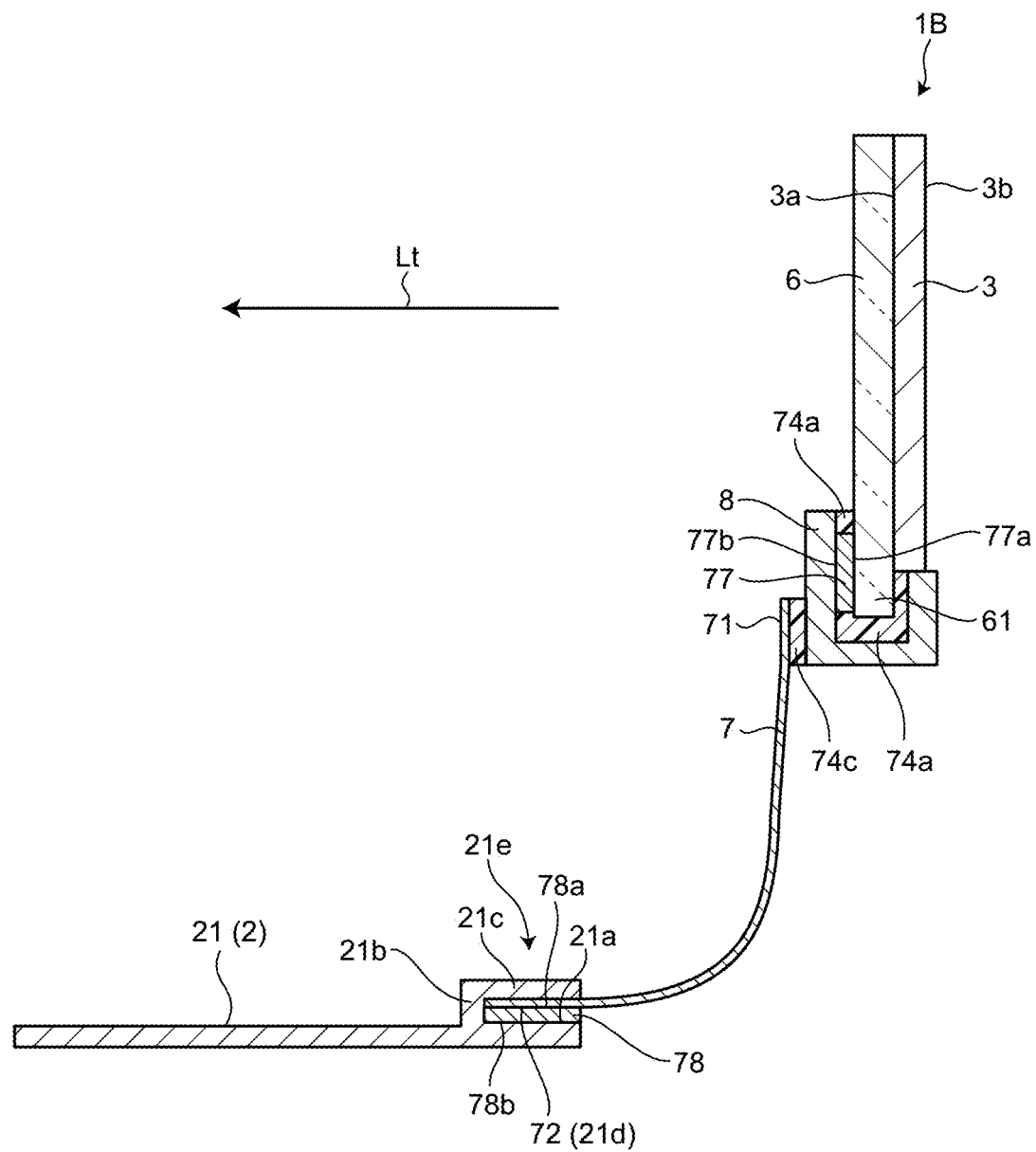
FIG. 4 is a diagram illustrating a connection example of a heat pipe according to a second modification of the embodiment.

FIG. 4 is a diagram illustrating a connection example of the heat pipe 7 of a vehicle display device 1B according to a second modification of the embodiment. The vehicle display device 1B illustrated in FIG. 4 is different from the vehicle display device 1 according to the embodiment in that the vehicle display device 1B includes Peltier elements 77 and 78.

The Peltier element 77 has a heat absorption surface 77a that absorbs heat and a heat dissipation surface 77b that dissipates the absorbed heat, depending on a direction of current flow. The Peltier element 77 is provided between the edge part 61 of the sapphire glass 6 and the heat-conductive frame member 8, with the heat absorption surface 77a in contact with the sapphire glass 6 and the heat dissipation surface 77b in contact with the heat-conductive frame member 8. The Peltier element 77 transfers the heat from the sapphire glass 6 to the heat-conductive frame member 8.

The Peltier element 78 has a heat absorption surface 78a that absorbs heat and a heat dissipation surface 78b that dissipates the absorbed heat, depending on a direction of current flow. The Peltier element 78 is provided between the other end 72 of the heat pipe 7 and the bottom surface 21a of the lower case 21, with the heat absorption surface 78a in contact with the other end 72 of the heat pipe 7 and the heat dissipation surface 78b in contact with the bottom surface 21a of the lower case 21. The Peltier element 78 transfers the heat from the other end 72 of the heat pipe 7 to the bottom surface 21a of the lower case 21.

As described above, the vehicle display device 1B includes the Peltier elements 77 and 78, the Peltier element 77 transfers the heat of the sapphire glass 6 to the heat-conductive frame member 8, and the Peltier element 78 transfers the heat of the heat pipe 7 to the lower case 21. Thus, the heat of the TFT 3 can be conducted to the lower case 21 efficiently through the sapphire glass 6 and the heat pipe 7 and accordingly, the temperature increase of the TFT 3 can be suppressed further.

Figure 5:
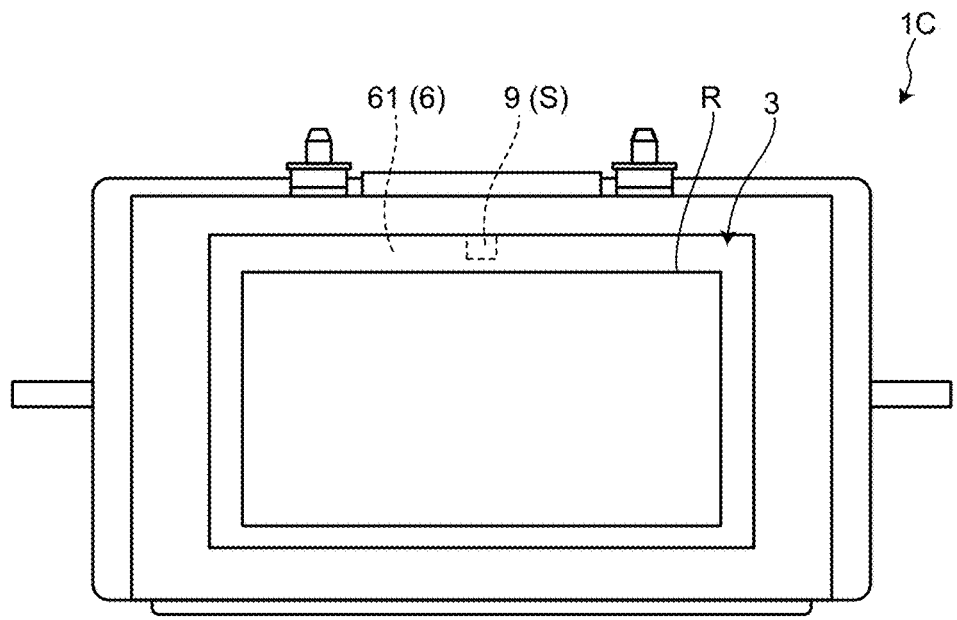
FIG. 5 is a diagram illustrating an installation position of a thermistor according to the embodiment.
Figure 6:
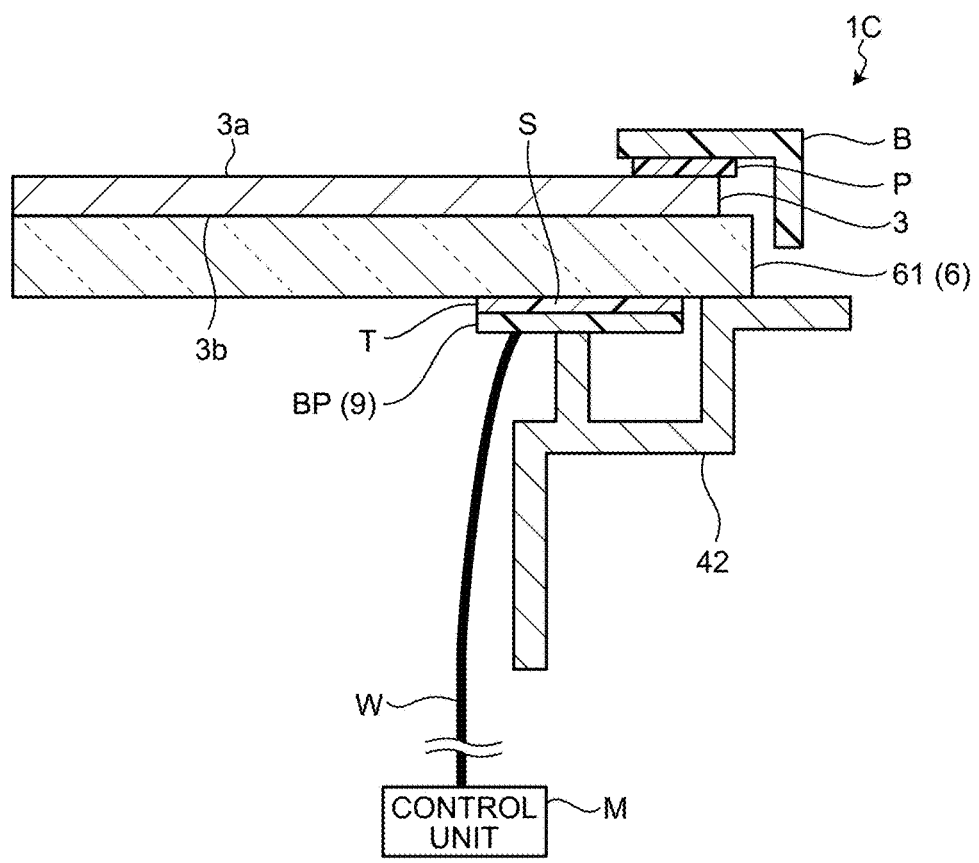
FIG. 6 is a diagram illustrating an attachment example of the thermistor according to the embodiment.

Next, an installation example of a thermistor 9 that detects the temperature of the TFT 3 is described. A vehicle display device 1C includes the thermistor 9 as a temperature sensor, as illustrated in FIG. 5 and FIG. 6. The thermistor 9 is provided on the sapphire glass 6 as illustrated in FIG. 5, with a temperature detection position S located at the edge part 61 of the sapphire glass 6 and outside a display region R where the TFT 3 displays the images. The thermistor 9 is located at a center of the edge part 61 of the sapphire glass 6 in the width direction. In the vehicle display device 1C, for example, the sapphire glass 6 is disposed in contact with the rear surface 3b of the TFT 3 as illustrated in FIG. 6. In other words, the vehicle display device 1C includes the sapphire glass 6 between the TFT 3 and the backlight case 42. The vehicle display device 1C has an aluminum substrate BP provided between the sapphire glass 6 and the backlight case 42. The aluminum substrate BP has the thermistor 9 mounted thereon, and the thermistor 9 is disposed in contact with the sapphire glass 6 through a thermal sheet T. The thermistor 9 is connected to a control unit M through a wire W. The control unit M controls the angles of the light source 41 of the backlight unit 4 and the mirror 5, based on the detection temperature detected by the thermistor 9. The control unit M, for example, reduces the luminance of the light source 41 of the backlight unit 4 relatively when the detection temperature detected by the thermistor 9 is higher than or equal to a predetermined reference temperature. When the detection temperature detected by the thermistor 9 is higher than or equal to the reference temperature, the control unit M may control the angle of the mirror 5 to prevent outside light from entering the TFT 3 through the mirror 5. In the vehicle display device 1C, a resin bezel B is provided at the edge part of the TFT 3 through packing P.

Figure 7:
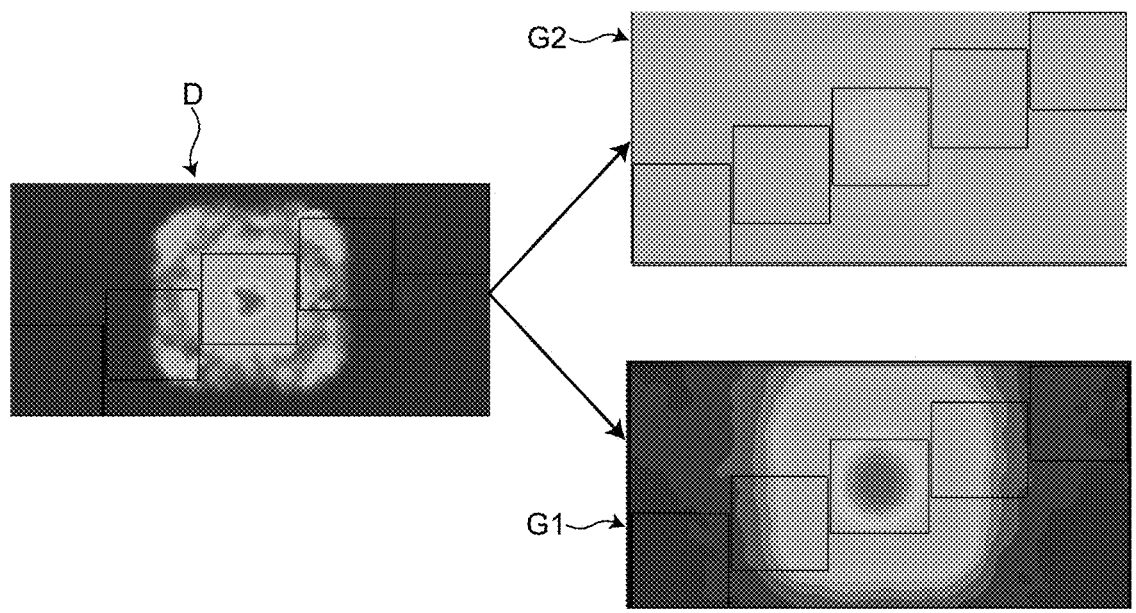
FIG. 7 is a diagram illustrating heat conduction according to the embodiment.

In the conventional vehicle display devices, the thermistor is disposed in contact with a soda lime glass, a water-white glass, etc. provided in the TFT, and this creates a delay in the conduction of the heat of the TFT to the thermistor through the soda lime glass, the water-white glass, etc. In the vehicle display device 1C according to the embodiment, the thermistor 9 is disposed in contact with the sapphire glass 6 provided in the TFT 3, so that the heat of the TFT 3 is quickly conducted to the thermistor 9 through the sapphire glass 6. This is because the heat conductivity of the sapphire glass 6 is about 40 W/m·K, whereas that of the ordinary soda lime glass and water-white glass is about 1 W/m·K. As illustrated in FIG. 7, the temperature distribution of the TFT 3 is as follows in a light condensing distribution D where outside light is condensed at the center of the TFT 3: a temperature distribution G1 with the center of the TFT 3 having high temperature in the case where the sapphire glass 6 is not provided in the TFT 3; and a temperature distribution G2 with the entire TFT 3 having the equal temperature because the heat of the TFT 3 conducts to the sapphire glass 6 in the case where the sapphire glass 6 is provided in the TFT 3. Thus, since the sapphire glass 6 is provided in the TFT 3 in the vehicle display device 1C, the temperature increase of the TFT 3 can be suppressed and the temperature of the TFT 3 can be detected accurately by the thermistor 9 disposed in contact with the sapphire glass 6. Accordingly, the process of suppressing the temperature increase of the TFT 3 can be performed at a suitable timing.

Figure 8:
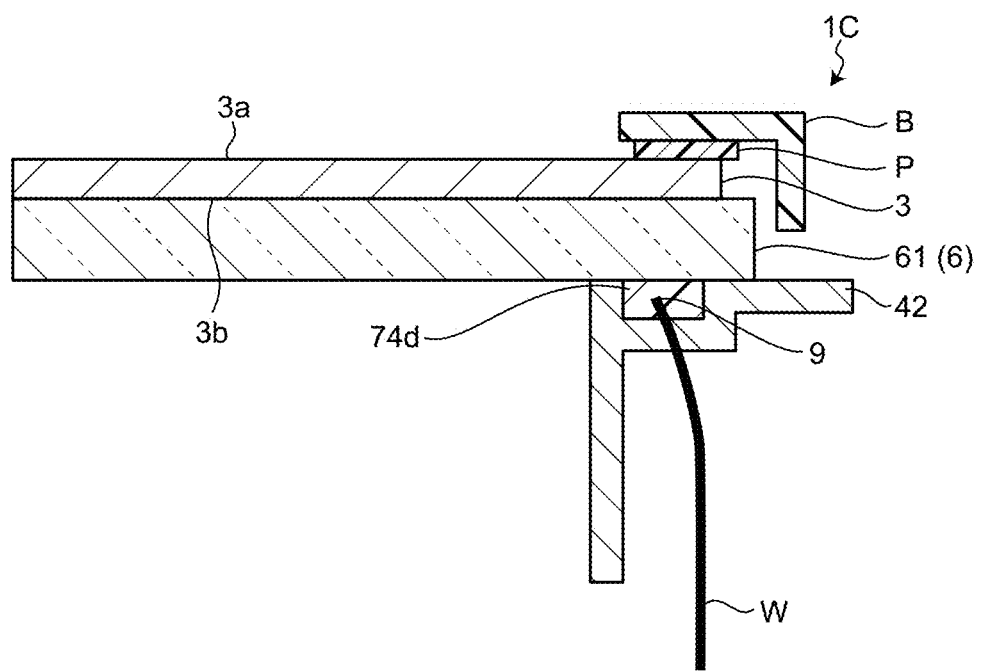
FIG. 8 is a diagram illustrating an attachment example of a thermistor according to a third modification of the embodiment.

FIG. 8 is a diagram illustrating an attachment example of the thermistor 9 according to a third modification of the embodiment. The thermistor 9 illustrated in FIG. 8 is provided between the sapphire glass 6 and the backlight case 42, and is accommodated in a recess part of the backlight case 42. In this state, the thermistor 9 is disposed in contact with the sapphire glass 6 through an adhesive 74d.

Figure 9:
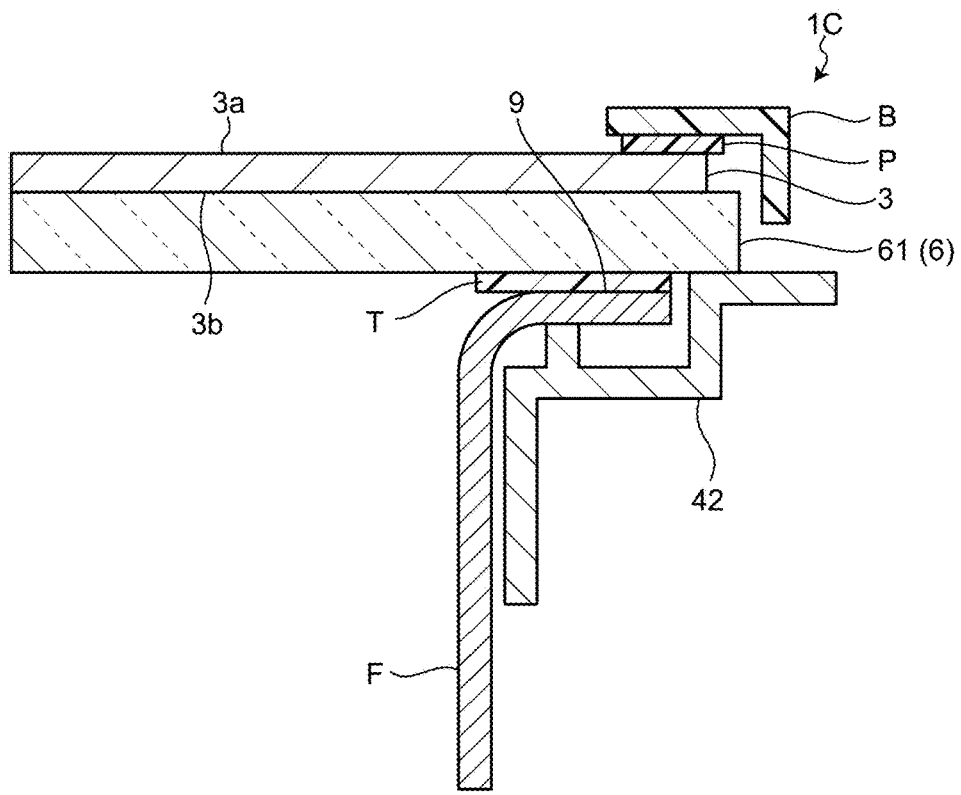
FIG. 9 is a diagram illustrating an attachment example of a thermistor according to a fourth modification of the embodiment.

FIG. 9 is a diagram illustrating an attachment example of the thermistor 9 according to a fourth modification of the embodiment. The thermistor 9 illustrated in FIG. 9 is provided on a flexible printed circuit (FPC) F and located between the sapphire glass 6 and the backlight case 42 and is disposed in contact with the sapphire glass 6 through the thermal sheet T.

Figure 10:
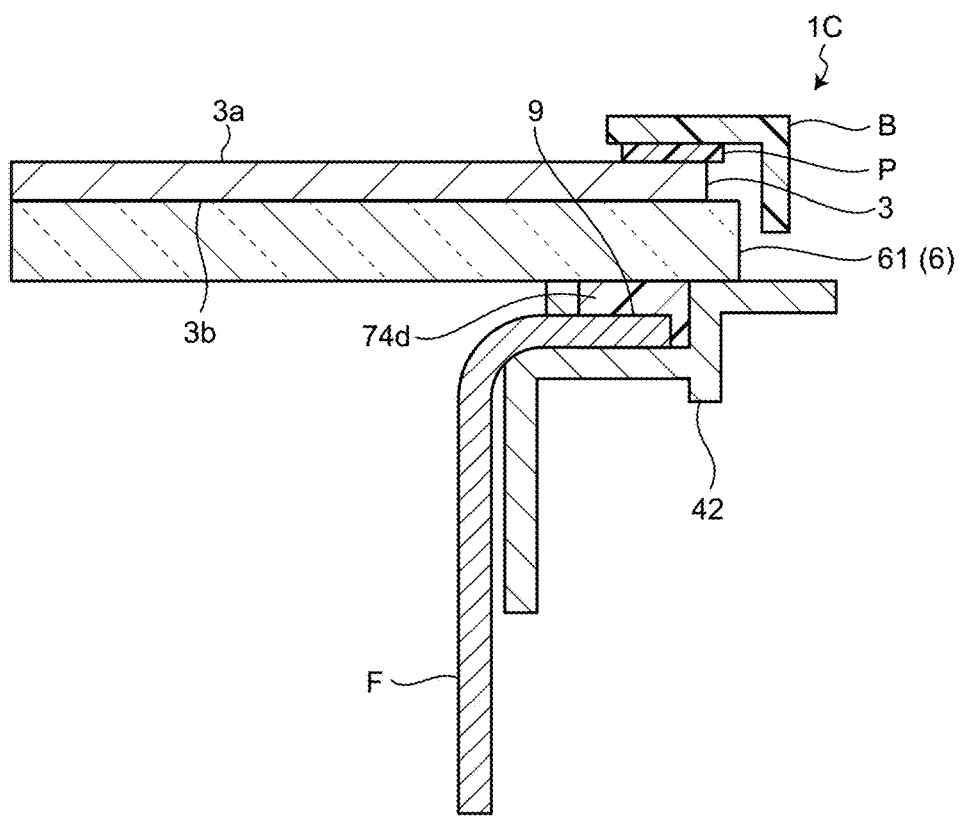
FIG. 10 is a diagram illustrating an attachment example of a thermistor according to a fifth modification of the embodiment.

FIG. 10 is a diagram illustrating an attachment example of the thermistor 9 according to a fifth modification of the embodiment. The thermistor 9 illustrated in FIG. 10 is provided on the flexible substrate F and located between the sapphire glass 6 and the backlight case 42 and is disposed in contact with the sapphire glass 6 through the adhesive 74d.

In the example described above, the heat-conductive plate member is the sapphire glass 6, however, the heat-conductive plate member is not limited to this and can be any other transparent heat-conductive member.

In the example described above, the heat dissipation part is the lower case 21 made of metal, however, the heat dissipation part is not limited to this. In another example, a heat sink may be provided separately.

The adhesives 74a, 74b, 74c, and 74d are adhesives with relatively high heat conductivity, and for example, thermal sheets may be used instead.

In the example described above, the heat pipe 7 is connected to the edge part 61 of the sapphire glass 6 on the lower side in the vertical direction, however, the present invention is not limited to this example. In another example, the heat pipe 7 may be connected to an edge part of the sapphire glass 6 on an upper side in the vertical direction, an edge part of the sapphire glass 6 in the width direction that intersects with the vertical direction, or the like.

In the example described above, the sapphire glass 6 is disposed in contact with the TFT 3 by optical bonding such as OCA or OCR; however, the present invention is not limited to this example. The sapphire glass 6 may be disposed in contact with the TFT 3 by other methods.

In the vehicle display device according to the present embodiment, the heat of the liquid crystal display element can be conducted to the heat dissipation part through the heat-conductive plate member and the heat pipe. Thus, the temperature increase of the liquid crystal display element can be suppressed.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A vehicle display device comprising:
   a housing including a heat dissipation surface that is located inside of the housing and dissipates heat;
   a liquid crystal display element that is accommodated in the housing;
   a mirror that is accommodated in the housing and reflects display light output from the liquid crystal display element toward a transparent reflection member of a vehicle;
   a transparent heat-conductive plate member with a transparent plate shape that is disposed in contact with any of a display surface and a rear surface of the liquid crystal display element; and
   a heat pipe that has one end connected to an edge part of the heat-conductive plate member and the other end mounted on the heat dissipation surface, and conducts heat of the heat-conductive plate member to the heat dissipation surface.

2. A vehicle display device comprising:
   a housing;
   a liquid crystal display element that is accommodated in the housing;
   a mirror that is accommodated in the housing and reflects display light output from the liquid crystal display element toward a transparent reflection member of a vehicle;
   a transparent heat-conductive plate member with a transparent plate shape that is disposed in contact with any of a display surface and a rear surface of the liquid crystal display element;
   a heat dissipation part that dissipates heat; and
   a heat pipe that has one end connected to an edge part of the heat-conductive plate member and the other end connected to the heat dissipation part, and conducts heat of the heat-conductive plate member to the heat dissipation part; and a heat-conductive frame member that is provided along the edge part of the heat-conductive plate member, wherein the one end of the heat pipe is connected to the edge part through the heat-conductive frame member, the heat-conductive plate member includes a first surface that faces toward to the liquid crystal display element and a second surface that opposes the first surface and faces away from the liquid crystal display element, and the heat-conductive frame member sandwiches both of the first surface and the second surface, and contacts both of the first surface and the second surface.

3. The vehicle display device according to claim 1, wherein the housing is formed of metal and functions as the heat dissipation surface, and the other end of the heat pipe is connected to the housing made of the metal.

4. The vehicle display device according to claim 2, wherein the housing is formed of metal and functions as the heat dissipation part, and the other end of the heat pipe is connected to the housing made of the metal.

5. The vehicle display device according to claim 1, further comprising:

a temperature sensor that detects temperature, wherein the heat-conductive plate member is formed of a sapphire glass, and the temperature sensor has a temperature detection position located at the edge part of the heat-conductive plate member.

6. The vehicle display device according to claim 2, comprising:

a temperature sensor that detects temperature, wherein the heat-conductive plate member is formed of a sapphire glass, and the temperature sensor has a temperature detection position located at the edge part of the heat-conductive plate member.

7. The vehicle display device according to claim 1, wherein the liquid crystal display element, the mirror, the heat-conductive plate member, the heat dissipation surface and the heat pipe are enclosed by the housing.

8. The vehicle display device according to claim 1, wherein the display light output is directed from the mirror towards a windshield.

* * * * *